United States Patent [19]

Duerr et al.

[11] Patent Number: 4,922,204

[45] Date of Patent: May 1, 1990

[54] ARRANGEMENT FOR OPERATING A SYMMETRICAL RADIO-FREQUENCY ANTENNA IN A NUCLEAR MAGNETIC RESONANCE TOMOGRAPHY APPARATUS

[75] Inventors: Wilhelm Duerr, Erlangen; Ralph Oppelt, Weiher, both of Fed. Rep. of Germany

[73] Assignee: Siemens Aktiengesellschaft, Berlin and Munich

[21] Appl. No.: 330,110

[22] Filed: Mar. 29, 1989

[30] Foreign Application Priority Data

Apr. 11, 1988 [DE] Fed. Rep. of Germany ....... 3811983

[51] Int. Cl.$^5$ .............................................. G01R 33/20
[52] U.S. Cl. ..................................... 324/322; 324/318
[58] Field of Search .................. 324/318, 322; 333/12; 334/820, 821, 822; 336/229

[56] References Cited

U.S. PATENT DOCUMENTS

| | | | |
|---|---|---|---|
| 3,961,331 | 6/1976 | Campbell | 343/821 |
| 4,028,704 | 6/1977 | Blass | 343/715 |
| 4,031,540 | 6/1977 | Borys, Jr. | 343/860 |
| 4,173,742 | 11/1979 | Lehmann | 333/12 |
| 4,578,664 | 3/1986 | Kinzler et al. | 336/229 |
| 4,620,155 | 10/1986 | Edelstein | 324/318 |
| 4,631,504 | 12/1986 | Matsuda et al. | 333/25 |
| 4,682,125 | 7/1987 | Harrison et al. | 333/12 |
| 4,818,957 | 4/1989 | Cort | 333/12 |

FOREIGN PATENT DOCUMENTS

60-235530 11/1985 Japan.
2161940 1/1986 United Kingdom.

OTHER PUBLICATIONS

"Coax-Speisung Symmetrischer Antennen," Auerbach, DL-QTC, No. 4, 1961, pp. 156-158.

*Primary Examiner*—Hezron E. Williams
*Assistant Examiner*—Louis M. Arana
*Attorney, Agent, or Firm*—Hill, Van Santen, Steadman & Simpson

[57] ABSTRACT

For operating the radio-frequency antenna of a nuclear magnetic resonance tomography apparatus, the antenna being connected to an asymmetrical line, a sheath wave trap is provided between the antenna and the line, with the inductor of the sheath wave trap being a toroid. A low-scatter sheath wave trap is obtained in this manner, particularly suitable for circularly polarized resonators. The trap suppresses difference currents caused by asymmetries, and thus simultaneously functions as a balanced-to-unbalanced transformer (balun).

5 Claims, 1 Drawing Sheet

ARRANGEMENT FOR OPERATING A SYMMETRICAL RADIO-FREQUENCY ANTENNA IN A NUCLEAR MAGNETIC RESONANCE TOMOGRAPHY APPARATUS

BACKGROUND OF THE INVENTION

1. Field of the Invention

The present invention is directed to an arrangement for operating a symmetrical radio-frequency antenna, and particularly an arrangement for operating the radio-frequency antenna of a nuclear magnetic resonance tomography apparatus which is connected to an asymmetrical line, with a sheath wave trap provided between the antenna and the line.

2. Description of the Prior Art

Nuclear magnetic resonance (also known as magnetic resonance imaging) devices are known in the art, which produce a tomogram of an examination subject, such as the human body, using the phenomenon of nuclear magnetic resonance. Such devices include a fundamental field magnet system, which aligns the nuclear spins in the examination subject, and also include gradient coils which generate a spatially different magnetic field, and also include a radio-frequency antenna for exciting the nuclear spins and for receiving the signals emitted by the excited nuclear spins during their return to an equilibrium state. Generally the inductance of such an antenna or coil is interconnected with a variable capacitance to form an LC resonant circuit, and the capacitance is then tuned to the desired frequency. A feeder for the antenna also contains a variable coupling capacitance for coupling the resonator to a radio-frequency generator, which is preferably an oscillator with a following transmission amplifier.

It is known that dipoles, directional radiators and other antennas which are low-resistent at the feed point can be fed with coaxial cables. Transmitters are generally designed so that only low-resistant, asymmetrical cables can be connected thereto. If a symmetrical load is to be fed, a balanced-to-unbalanced transformer (balun) must be interposed, the exact tuning thereof usually being relatively complex and time-consuming, given frequency changes.

Coaxial cables are asymmetrically constructed, and because such cables can, as a practical matter, only exhibit low impedance for low losses, only connection at an antinode is considered for feeding antennas. If, for example, the inner and outer conductor of the asymmetrical coaxial cable are connected to the two balanced-to-ground halves of the radiator, the sum of the forward or return current in the inner and outer conductors of the cable differs from zero, because the two radiator halves do not exhibit completely symmetrical properties relative to the environment, for example relative to ground. As a consequence as of this current difference, a so called sheath wave is formed, the amplitude thereof being particularly high when the cable length is in resonance with the wavelength of the envelope wave. To limit the losses by eliminating such sheath waves, it is known to insert a sheath wave trap between the antenna terminal and the cable, the sheath wave trap essentially consisting of an inductor. The best suppression of sheath waves is obtained with a double inductor, consisting of two halves of a cylindrical coil. The antenna is connected between the two halves. Such an sheath wave trap is described in the article "Coax-Speisung Symmetrischer Antennen," Auerbach, DL-QTC, No. 4, 1961, pages 156–158.

SUMMARY OF THE INVENTION

It is an object of the present invention to provide an improved and simplified sheath wave trap suitable for use in the antenna circuit in a nuclear magnetic resonance tomography apparatus.

The arrangement disclosed herein is based on the perception that in conventional sheath wave trap, a coupling of the field of the antenna with the stray field of the sheath wave trap cannot be completely eliminated. In accordance with the principles of the present invention, an sheath wave trap is provided wherein the inductor is in the form of a toroid, preferably a toroidal core. In this embodiment of the sheath wave trap, there is substantially no stray field. The toroidal core may consist of plastic, or may consist of a highly permeable material e. g. with a permeability of 5 to at least 200, in a preferred embodiment.

DESCRIPTION OF THE PREFERRED EMBODIMENTS

Figure 1:
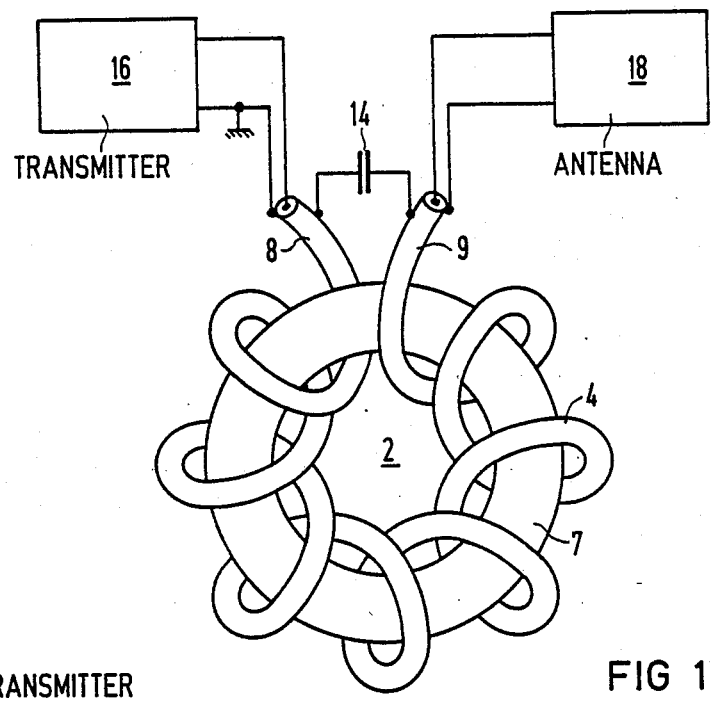
FIG. 1 is a plan view of an sheath wave trap constructed in accordance with the principles of the present invention, with the connection to the relevant electrical components being schematically shown.

A first embodiment of a sheath wave trap 2 constructed in accordance with the principles of the present invention is shown in FIG. 1. The sheath wave trap 2 consists of a coaxial cable 4 arranged on a toroidal core 7, wound as a toroid. The ends 8 and 9 of the outer sheath of the coaxial cable 4 are connected to each other via a capacitor 14, and form a parallel resonant circuit in combination with the inductance of the coaxial cable 4. The inner conductor of the cable end 8 is connected to a source, for example, to a transmitter 16. The outer sheath of the cable end 8 is also connected to the transmitter 16, and is grounded as well. A symmetrical load, for example a dipole antenna 18, which may be the radio-frequency antenna of a nuclear magnetic resonance tomograph apparatus having an operating frequency of, for example, 42 MHz, is connected to the other cable end 9.

In the transmitting mode, the asymmetrical transmitter thus feeds a symmetrical load. Due to the resonance condition, the sheath wave trap 2 represents a high-impedance resistor which decouples sheath waves of the dipole antenna 18 from the transmitter 16. In the receiving mode, the antenna 18 functions as a symmetrical source, and transmits the radio-frequency signal which it has received to a receiver, which functions as a symmetrical load. In this case as well, sheath waves cannot pass from the source to the load. In both cases, the sheath wave barrier 2 simultaneously functions as a balanced-to-unbalanced transformer, so that a coupling of the field of the dipole antenna 18 to the stray field of the sheath wave trap 2 is substantially eliminated.

Under certain circumstances, it is preferable not to insert the capacitor 14 between the cable ends 8 and 9. If the capacitor 14 is eliminated, the number of turns of the coaxial cable 4 and the relative permeability $\mu_r$ of the core 7 are selected so that the inductance L is much greater than the quotient $Z/\omega$, wherein $\omega$ is the operating frequency and Z is the characteristic impedance of the cable 4. A broadband sheath wave trap is thus obtained.

Figure 2:
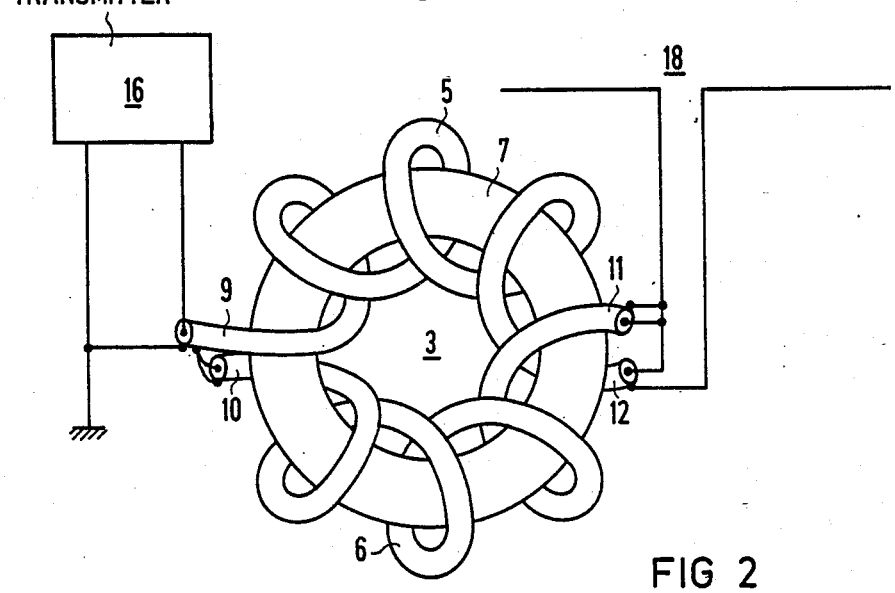
FIG. 2 is a plan view of a further embodiment of an sheath wave trap constructed in accordance with the principles of the present invention, with the connection to the relevant electrical components being schematically shown.

In a further embodiment of a sheath wave trap 3 shown in FIG. 2, the wave trap 3 is in the form of a double inductor, with two coaxial cables 5 and 6 wound around the toroidal core 7. The transmitter 16 is connected as a source to the ends 9 and 10 of the cables. Two radiator halves (not shown in detail) of the dipole antenna 18 are connected to the other ends 11 and 12 as a load. The left-side radiator half is connected to the sheath of the cable end 11, and to the two inner conductors. The other radiator half is connected to the sheath of the cable end 12. The two coaxial cables 5 and 6 have the same number of turns, the same conductor lengths, and the same characteristic impedance, and are both connected to the transmitter 16 at the transmission side. The two sheaths of the ends 9 and 10, and the inner conductor of the cable end 10, are connected together and to the transmitter 16 and to ground. The inner conductor of the cable end 9 is connected to the transmitter 16.

Although modifications and changes may be suggested by those skilled in the art it is the intention of the inventors to embody within the patent warranted hereon all changes and modifications as reasonably and properly come within the scope of their contribution to the art.

We claim as our invention:

1. In a nuclear magnetic resonance tomography apparatus having a symmetrical radio-frequency antenna and an asymmetrical line for carrying signals to and from said antenna, the improvement of a sheath wave trap connected between said antenna and said line, said sheath wave trap comprising an inductor in the shape of a toroid.

2. The improvement of claim 1, wherein said inductor is a cable wound on a toroidal core.

3. The improvement of claim 2, wherein said toroidal core consists of highly permeable material.

4. The improvement of claim 1, wherein said inductor consists of a single cable wound around a toroidal core.

5. The improvement of claim 1, wherein said inductor consists of two coaxial cables having the same line length, the same number of turns and the same characteristic impedance wound around a common toroidal core, and wherein said antenna has two radiator halves connected between said two cables.

* * * * *